(12) United States Patent
Symanczyk et al.

(10) Patent No.: US 7,329,561 B2
(45) Date of Patent: Feb. 12, 2008

(54) FABRICATING MEMORY COMPONENTS (PCRAMS) INCLUDING MEMORY CELLS BASED ON A LAYER THAT CHANGES PHASE STATE

(75) Inventors: Ralf Symanczyk, München (DE); Cay-Uwe Pinnow, München (DE); Thomas Happ, Tarrytown, NY (US)

(73) Assignee: Infineon Technologies, AG, Neubiberg (DE)

( * ) Notice: Subject to any disclaimer, the term of this patent is extended or adjusted under 35 U.S.C. 154(b) by 350 days.

(21) Appl. No.: 11/210,112

(22) Filed: Aug. 24, 2005

(65) Prior Publication Data

US 2006/0046379 A1  Mar. 2, 2006

(30) Foreign Application Priority Data

Aug. 30, 2004 (DE) .................. 10 2004 041 893

(51) Int. Cl.
*H01L 21/06* (2006.01)
(52) U.S. Cl. ................. 438/102; 438/103; 257/E21.068
(58) Field of Classification Search ................ 438/102, 438/103; 257/E21.068
See application file for complete search history.

(56) References Cited

U.S. PATENT DOCUMENTS

| 6,611,034 | B2 * | 8/2003 | Den ........................... 257/421 |
| 6,768,157 | B2 * | 7/2004 | Krieger et al. ............... 257/314 |
| 6,949,793 | B2 * | 9/2005 | Choi et al. ................... 257/316 |
| 7,149,155 | B2 * | 12/2006 | Schut et al. .............. 369/13.54 |

| 2004/0052117 | A1 | 3/2004 | Jiang |
| 2004/0142503 | A1 | 7/2004 | Lee et al. |

FOREIGN PATENT DOCUMENTS

EP    1 400 979 A2    3/2003

OTHER PUBLICATIONS

B. Prince, "Emerging Memories", *Technologies and Trends*, Kluwer Academic Publishers, 2002.

(Continued)

*Primary Examiner*—Michael Lebentritt
*Assistant Examiner*—Angel Roman
(74) *Attorney, Agent, or Firm*—Edell, Shapiro & Finnan, LLC (57) ABSTRACT

A method is describe for fabricating memory components including memory cells based on an active material of an active layer, the phase state of which can be changed and which is enclosed between a bottom electrode and a top electrode. To reduce the current intensity of the programming current and the erase current required for programming and erasing of the memory element and therefore the quantity of heat which is required to change the phase state, a nanoporous aluminium oxide layer is used as a mask during the production of the active layer or the interface with the electrodes. The nanoporous aluminium oxide layer can be used as a positive mask, as a negative mask, or used directly as an insulating current aperture. The contact surface between electrode and active layer can be set in virtually any desired form by varying the process parameters of the aluminium oxide mask. Since the typical cell area of the memory cell is significantly larger than the mean diameter of the nanopores, a good homogeneity and reproducibility of the contacts results from a production engineering standpoint.

31 Claims, 8 Drawing Sheets

OTHER PUBLICATIONS

Y.N. Hwang et al., "Completely CMOS compatible Phase-Change Nonvolatile RAM Using NMOS Cell Transistors", *IEEE Proceedings of the Non-Volatile Semiconductor Memory Workshop*, 2003.

G. Wicker, "Nonvolatile High density, High Performance Phase Change Memory", *SPIE Conference on Electronics and Structures for MEMS*, vol. 3891, 1999.

H. Masuda and K. Fukuda, "Ordered Metal Nanohole Arrays Made by a Two-Step Replication of Honeycomb Structures of Anodic Alumina", *Science* 268, 1995.

K. Liu et al., "Fabrication and thermal stability of arrays of Fe Nanodots", *Appl. Phys. Lett.* 81, 2002.

\* cited by examiner

FABRICATING MEMORY COMPONENTS (PCRAMS) INCLUDING MEMORY CELLS BASED ON A LAYER THAT CHANGES PHASE STATE

CROSS REFERENCE TO RELATED APPLICATIONS

This application claims priority under 35 USC § 119 to German Application No. 102004041893.4, filed on Aug. 30, 2004, and titled "Method for Fabrication memory Components (PCRAMS) Comprising Memory Cells Based on a Layer, the Phase State of Which Can Be Changed," the entire contents of which are hereby incorporated by reference.

FIELD OF THE INVENTION

The invention relates to a method for fabricating memory components including memory cells based on a layer of an active material, the phase state of which can be changed from an amorphous state to a crystalline state and back into an amorphous state by in each case a first and second current pulse flowing between a bottom electrode, which is produced on/in a substrate, and a top electrode, the layer of the active material being enclosed between the bottom and top electrodes.

BACKGROUND

Data memory cells based on materials where the phase state can change (PCRAMs) represent a promising new technology that may possibly replace technologies that are currently standard, such as DRAM and flash memories (see, e.g., B. Prince, *Emerging Memories, Technologies and Trends*, Kluwer Academic Publishers, 2002). In this type of memory cells, the phase state (amorphous or crystalline) of a chalcogenide-containing material (typically Ge—Sb—Te or Ag—In—Sb—Te compounds) is used to store a data bit. The fact that the amorphous and crystalline phases of these compounds differ significantly in terms of their electrical conductivity is exploited to read the information.

A cell which is in the amorphous (high-resistance) state is programmed into the crystalline phase (low-resistance) by an electric current pulse heating the material to above the crystallization temperature by Joule heat, enabling the material to (partially) crystallize. The memory cell is reset or erased by the material being heated to above the melting point, which is higher than the crystallization temperature, by a second current pulse, and then converting it into the amorphous state by rapid cooling.

One of the main technical problems in implementing this technology is that high current densities are required for both the writing operation and the erasing operation. This results from the quantity of Joule heat which is required to heat the active material to above the crystallization temperature or melting point. However, when a cell of this type is integrated in a silicon CMOS process with advanced miniaturization, there are limits on the level of current densities that can be used. For example, if the currents required to operate a PCRAM cell of this type are higher than the currents which a single CMOS transistor of minimum feature size is able to withstand, the PCRAM is no longer able to realize a compact cell array with a competitive cell area. Furthermore, a further reduction in the current is desirable from the perspective of the particular applications, since the energy consumption is then reduced and/or highly parallel programming of the cells becomes possible.

Since the quantity of heat which is required to program a memory cell of a PCRAM memory, and therefore also the current, are proportional to the volume of glass which is transformed, various strategies are generally being pursued with a view to minimizing the spatial dimensions of the active material which is to be transformed. In recent years, many tests have been undertaken with a view to reducing the contact surface area between at least one metallic electrode and the active material of a PCRAM memory cell by lithography or by suitable layout. Examples include the structures produced by a laser process as shown by Samsung at the NVSMW 2003 (Y. N. Hwang et al., *Completely CMOS compatible Phase-Change Nonvolatile RAM Using NMOS Cell Transistors*, IEEE Proceedings of the Non-Volatile Semiconductor Memory Workshop, 2003), or what is known as the etch cell, in which the interface with the active material is horizontal in form (e.g., G. Wicker, *Nonvolatile High density, High Performance Phase Change Memory*, SPIE Conference on Electronics and Structures for MEMS, Vol. 3891, 1999).

Despite a significant reduction in the programming and erasing currents, the techniques which have been disclosed hitherto are still far from achieving the target specifications or desirable maximum currents.

SUMMARY

In view of the above, it is an object of the present invention to provide an improved method for fabricating memory components including memory cells based on an active layer, the phase state of which can be changed, which method allows the contact surface area between, for example, bottom electrode and active material to be set at virtually any desired size, and also contributes to a significantly greater reduction in the programming and erase currents for a PCRAM of this type.

The above and other objects are achieved in accordance with the invention by providing a method in which self-patterning nanopores are produced in aluminium layers. In a fabrication method according to the invention, a nanoporous aluminium oxide layer is produced by oxidation of an aluminium layer in suitable electrolytes (e.g. oxalic acid, sulphuric acid) and is used either as a negative mask or as a positive mask for the subsequent deposition of the active layer, or can also be used directly as an insulating current aperture.

The pores are formed during the anodic oxidation of the aluminium layer, for example in oxalic acid or sulphuric acid. Depending on the layer thickness and oxidation conditions selected, such as time, electric voltage, chemical concentration of the acid used, self-organized, homogenous, hexagonally closely packed arrangements of the pores with a diameter of down to as little as 4 nm are formed (see, e.g., H. Masuda and K. Fukuda, *Ordered Metal Nanohole Arrays Made by a Two-Step Replication of Honeycomb Structures of Anodic Alumina*, Science 268, 1995 and K. Liu et al., *Fabrication and thermal stability of arrays of Fe nanodots*, Appl. Phys. Lett. 81, 2002).

In a first embodiment of the invention, a method is provided for fabricating memory components comprising memory cells based on an active layer of an active material, the phase state of which can be changed from an amorphous state to a crystalline state and back into an amorphous state by in each case a first and second current pulse flowing between a bottom electrode, which is produced on/in a substrate, and a top electrode, the active layer being enclosed between the bottom and top electrodes, where an aluminium oxide layer that includes nanopores is formed above the bottom electrode by a first step, an insulator material is deposited directly on top of the aluminium oxide layer and into its nanopores by a step which follows the first step, the aluminium oxide layer and in addition the insulator material which projects above the aluminium oxide layer are removed by a third step, and the active layer is deposited over the insulator material, which has in this way been patterned as a positive mask using the aluminium oxide layer, by a fourth step.

Furthermore, according to a second embodiment of the invention, a method is provided for fabricating memory components comprising memory cells based on an active layer of an active material, the phase state of which can be changed from an amorphous state to a crystalline state and back into an amorphous state by in each case a first and second current pulse flowing between a bottom electrode, which is produced on/in a substrate, and a top electrode, the active layer being enclosed between the bottom and top electrodes, where an aluminium oxide layer which includes nanopores is formed on top of the substrate, which has been pre-processed as far as metallization, by a first step, the material of the bottom electrode is deposited directly over the aluminium oxide layer and into its nanopores and material of the bottom electrode which projects above the aluminium oxide layer is removed, by a second step which follows the first step, the aluminium oxide layer is then removed by a third step, an insulator material is deposited directly over the bottom electrode by a fourth step, the insulator material is planarized down to the bottom electrode by a fifth step, and the active layer is deposited over the patterned bottom electrode and the insulator material by a sixth step.

In accordance with a third embodiment of the invention, a method is provided for fabricating memory components comprising memory cells based on an active layer of an active material, the phase state of which can be changed from an amorphous state to a crystalline state and back into an amorphous state by in each case a first and second current pulse flowing between a bottom electrode, which is produced on/in a substrate, and a top electrode, the active layer being enclosed between the bottom and top electrodes, characterized in that the material of the bottom electrode is deposited areally on top of the substrate, which has been pre-processed as far as the metallization, by a first step, an aluminium oxide layer which includes nanopores is formed as an etching mask, directly above the material of the bottom electrode, for the patterning of the bottom electrode, by a second step which follows the first step, the bottom electrode is etched using the nanoporous aluminium oxide layer formed in the second step, by a third step, the aluminium oxide layer is then removed by a fourth step, an insulator material is deposited over the patterned bottom electrode by a fifth step, the insulator material is planarized as far as the bottom electrode by a sixth step, and the active layer is deposited over the patterned bottom electrode and the insulator material by a seventh step.

The nanoporous aluminium oxide layer can be used firstly as a mask for the deposited insulator material, secondly as a mask for the patterning of the bottom electrode or thirdly can be used directly as a current aperture.

Preferably, the aluminium oxide layer which includes the nanopores is formed by anodic oxidation of a deposited aluminium layer in a suitable electrolyte (e.g. oxalic acid, sulphuric acid). Depending on the layer thickness and oxidation conditions selected, such as time, electric voltage, chemical concentration of the electrolytes, self-organized, homogenous, hexagonally closely packed arrangements of pores with diameters down to as little as 4 nm are formed.

The material used for the bottom electrode is preferably tungsten or TiN or TiW or TiAlN. The material used for the insulator layer can be $SiO_2$ or $Si_3N_4$. The material used for the active layer can be, e.g., $Ge_2Sb_2Te_5$ or alternatively an Ag—In—Sb—Te compound. As the final fabrication step, the top electrode is deposited over the active layer and patterned.

When a nanoporous aluminium oxide layer is used as mask for the production of the active layers (and the electrodes) in the process for fabricating what are known as "phase change memory elements" in accordance with the invention, the following advantages are realized:

a) Only CMOS-compatible materials and processes (aluminium, deposition, electrochemical etching) are used for this technique.
b) The contact surface between electrode and active material can be set in virtually any desired form by varying the process parameters of the aluminium oxide mask. It is in particular possible to produce surfaces of sublithographic area, which drastically reduces the current required for programming and erasing.
c) The typical cell surface area is significantly larger than the mean pore diameter, which means a good homogeneity and reproducibility of the contacts from a production engineering perspective.
d) A wide range of materials or combinations of materials can be used for an electrical insulator as "filling medium" in the cell. This allows the thermal management to be adapted during the heating and cooling phases and therefore allows the switching properties to be improved further.

The above and still further objects, features and advantages of the present invention will become apparent upon consideration of the following detailed description of specific embodiments thereof, particularly when taken in conjunction with the accompanying drawings where like numerals designate like components.

DETAILED DESCRIPTION

Figure 1A:
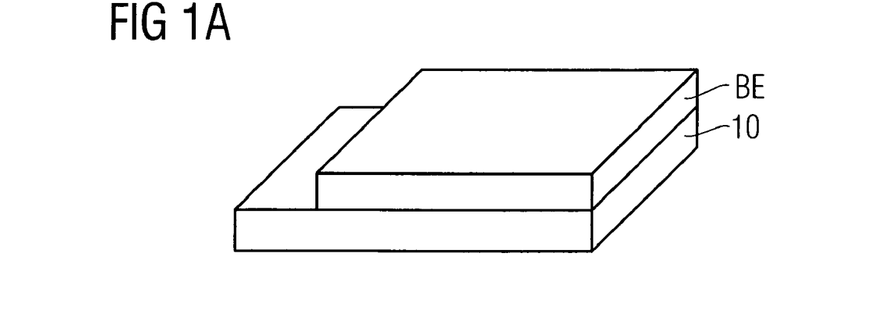
FIG. 1A-1G are diagrammatic, perspective cross-sectional views of individual process steps of a fabrication method in accordance with a first embodiment of the invention, where a nanoporous aluminium oxide layer is used as a positive mask.
Figure 1B:
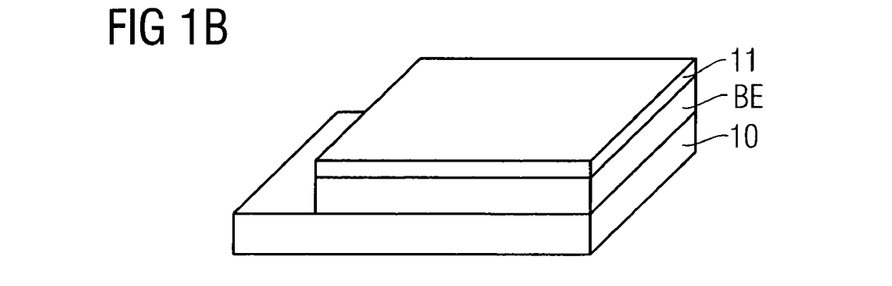
Figure 1C:
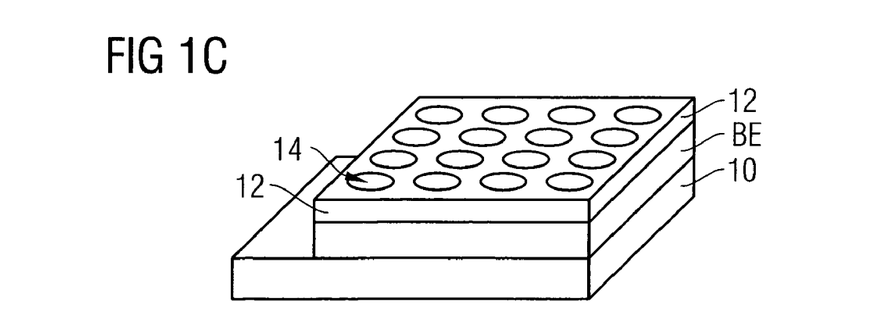

A process sequence corresponding to a first embodiment of the invention for the fabrication of the PCRAM memory element, in which the AlOx layer is used as a positive mask, is described with reference to FIGS. 1A-1G. At the start, as shown in FIG. 1A, a substrate 10 that has been pre-processed as far as the bottom electrode BE is provided. The bottom electrode BE may contain, e.g., W, TiN, TiW, TiAlN or another suitable metallic material. As shown in FIG. 1B, an aluminium layer 11 is deposited over the bottom electrode BE, and as shown in FIG. 1C, this aluminium layer 11 is subjected to anodic oxidation, during which self-organized, homogenous and hexagonally closely packed arrangements of nanopores 14 with diameters down to as little as 4 nm (typical diameter $\leq 10$ nm) are formed in the aluminium oxide layer 12.

Figure 1D:
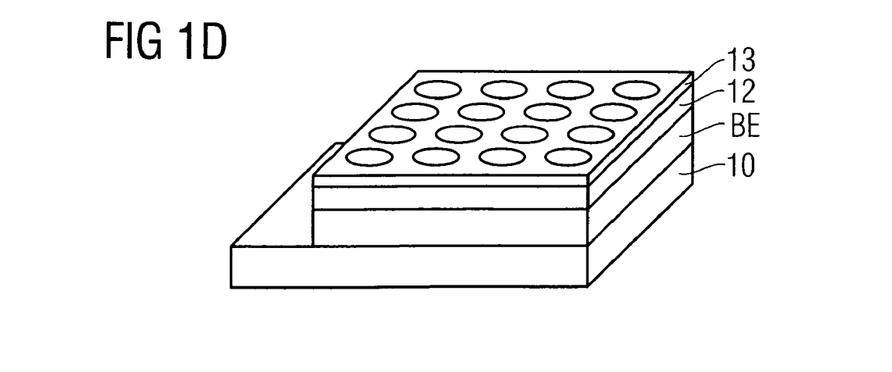
Figure 1E:
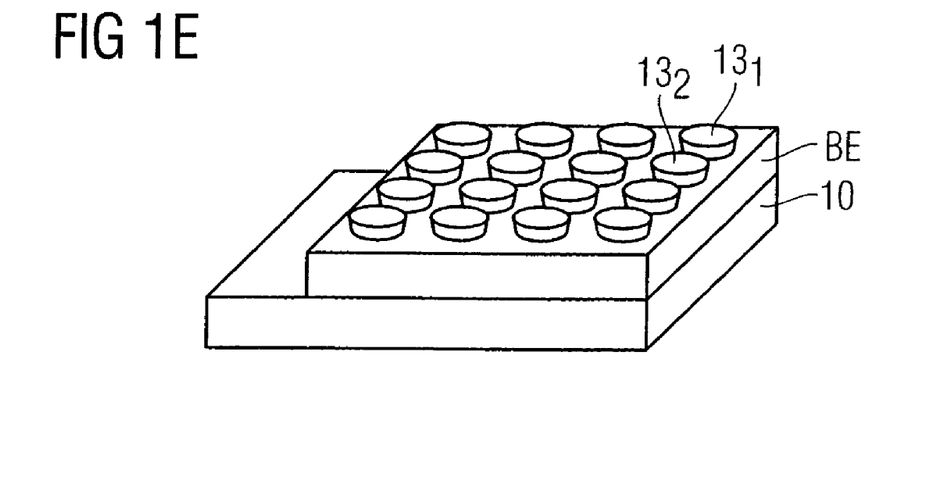

Then, as shown in FIG. 1D, an electrical insulator layer 13, for example of $SiO_2$, $Si_3N_4$ or another suitable insulator material, is deposited over the aluminium oxide layer 12 and into its nanopores 14. Then, referring to FIG. 1E, the aluminium oxide mask 12 and with it the layer 13 of the insulator material above it are removed, for example by a lift-off or selective etching process. What remains is the pillars or rods 131, 132 of the insulator material which are conformal with the nanopores and are shown in FIG. 1E.

Figure 1F:
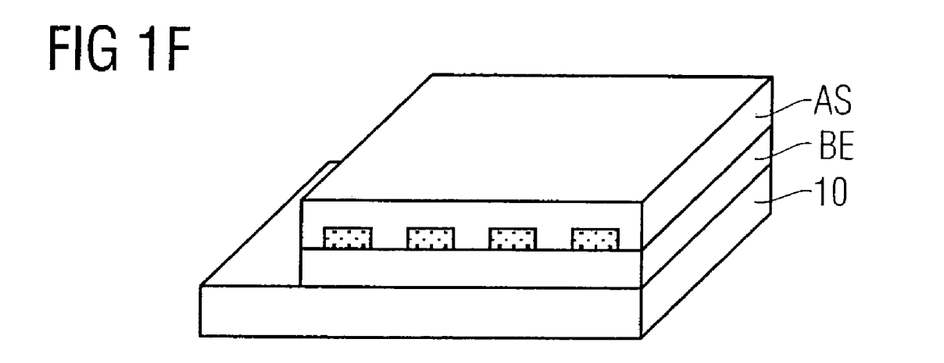

Next, as shown in FIG. 1F, the phase change material of the active layer AS is deposited over the bottom electrode BE and the remaining pillars or rods 131, 132. The material of the active layer AS may be, e.g., $Ge_2Sb_2Te_5$.

Figure 1G:
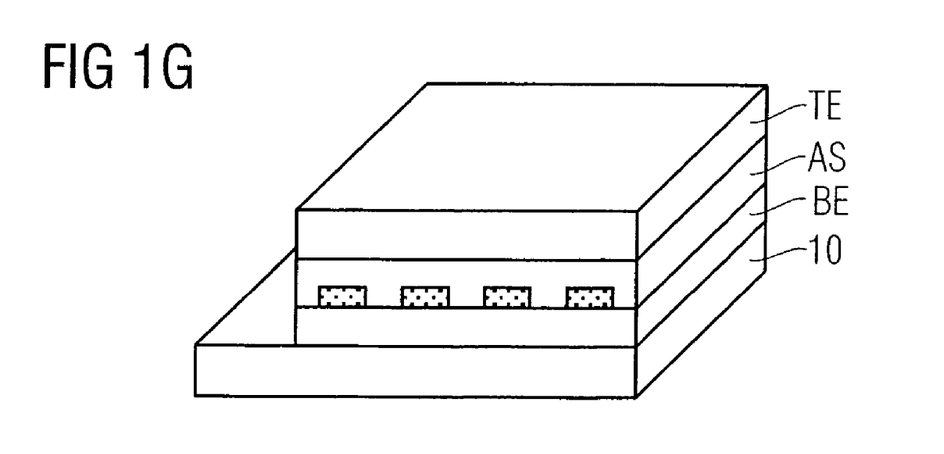

Finally, referring to FIG. 1G, the metallization for the top electrode TE is deposited.

In an alternative form of fabrication (not shown), it is possible to deposit the insulator layer first of all, then to deposit and anodically oxidize the aluminium layer and use it as an etching mask for the patterning of the insulator layer. It should be mentioned that further patterning operations and processes can follow in the method for fabricating the memory components having memory cells based on a phase change material, but these further patterning operations and processes are not illustrated in the figures since they will be familiar to the person skilled in the field of CMOS processing.

A second embodiment of the invention, in which a nanoporous aluminium oxide layer is used as a negative mask, is described below with reference to FIGS. 2A-2I.

Figure 2A:
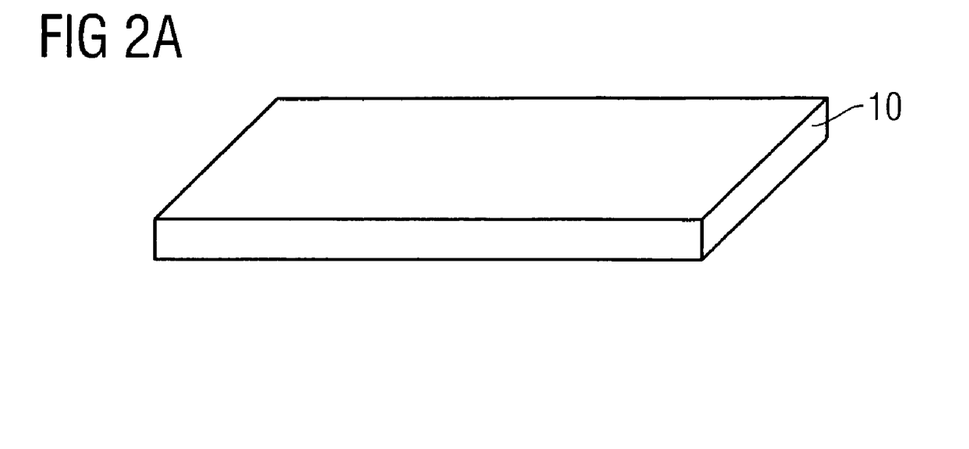
FIGS. 2A-2I are diagrammatic, perspective cross-sectional views of individual process steps of a fabrication method in accordance with a second embodiment of the invention, where a nanoporous aluminium oxide layer is used as a negative mask.
Figure 2B:
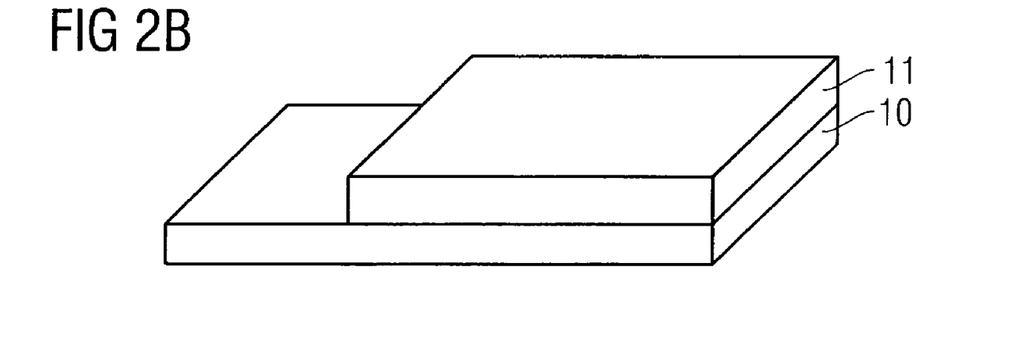
Figure 2C:
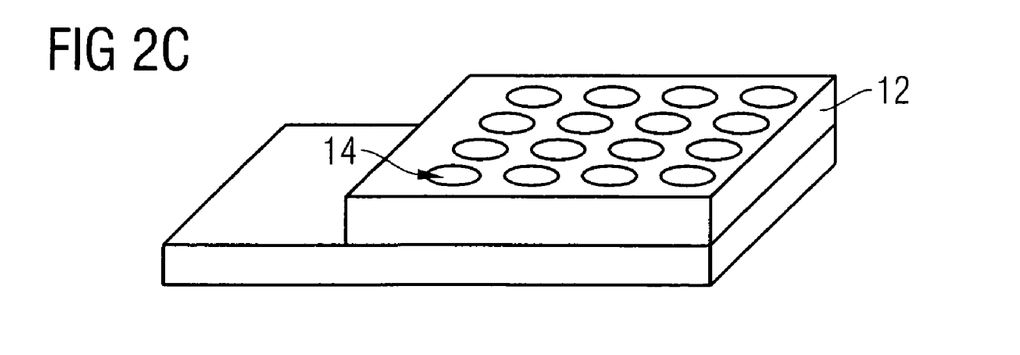

The starting point, as shown in FIG. 2A, is a substrate 10 which has been pre-processed as far as the metallization. As shown in FIG. 2B, an aluminium layer 11 is deposited over the substrate 10 and this aluminium layer 11, as shown in FIG. 2C, is anodically oxidized to form an aluminium oxide layer 12 having the abovementioned self-organized nanopores 14.

Figure 2D:
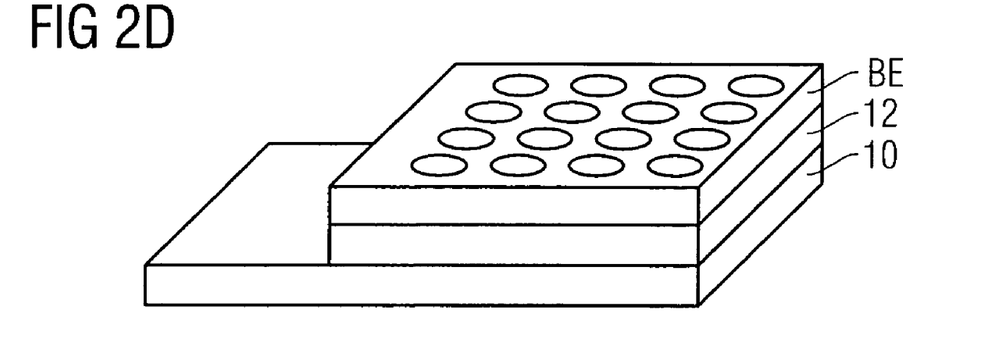
Figure 2E:
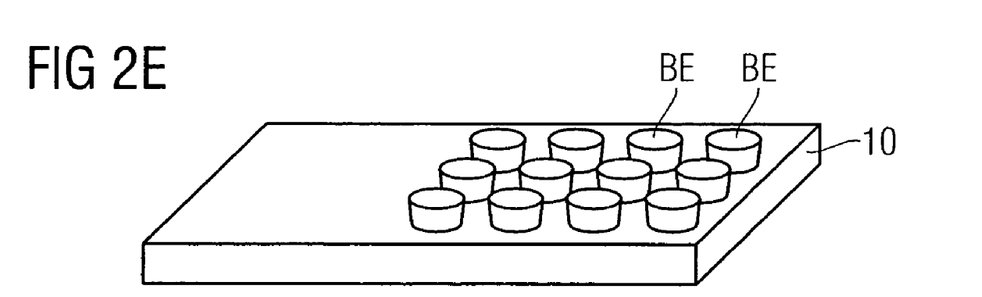
Figure 2F:
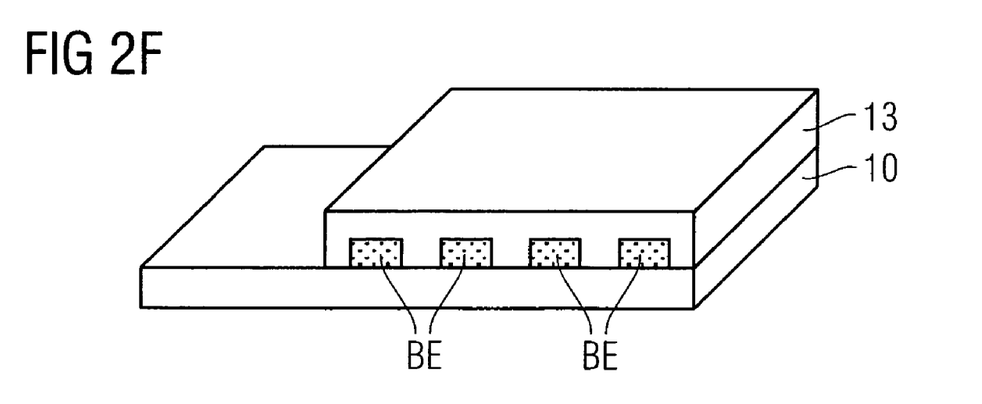

Referring to FIG. 2D, the next step is deposition of the metallization for the bottom electrode BE over the aluminium oxide layer 12 and into the nanopores 14. Then, as shown in FIG. 2E, the aluminium oxide layer 12 is removed by a lift-off process or by selective etching, together with the metal layer of the bottom electrode BE which is located above this aluminium oxide layer 12. In this case, small pillars or rods of the bottom electrode BE remain on the metallized substrate 10. Referring to FIG. 2F, an electrical insulator layer 13 is deposited over the substrate 10 and the remaining rods or pillars of the bottom electrode BE. By way of example, $SiO_2$ or $Si_3N_4$ can be used for the material of the electrical insulator layer 13.

Figure 2G:
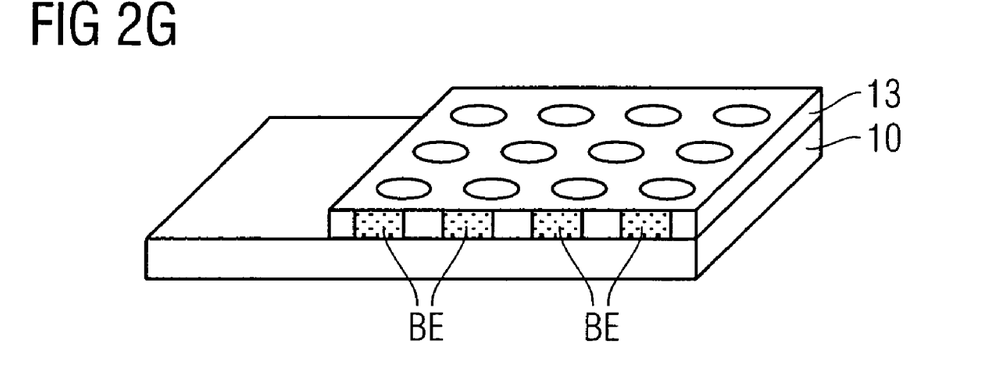
Figure 2H:
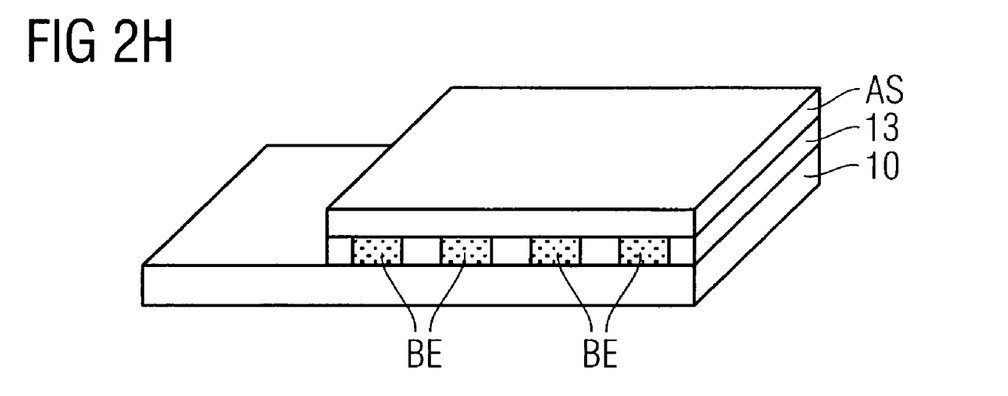

Then, as shown in FIG. 2G, this insulator layer 13 is planarized and thinned back as far as the pillars or rods of the bottom electrode BE. Next, the material of the active layer AS, e.g. $Ge_2Sb_2Te_5$, is deposited over this level.

Figure 2I:
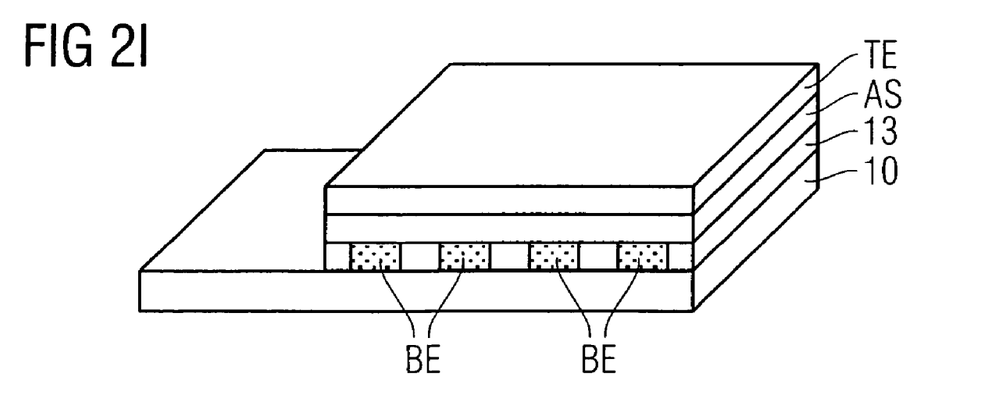

Finally, as shown in FIG. 2I, the metallization for the top electrode TE is deposited over the active layer AS.

In an alternative procedure (not shown), it is also possible first of all to deposit the metal layer of the bottom electrode BE areally, then to deposit the aluminium layer 11 above it, to anodically oxidize the aluminium layer 11 to form the self-organized nanopores 14, and then to use this structure as an etching mask for the patterning of the bottom electrode BE. Then, the bottom electrode BE is filled with an insulator material and planarized by CMP.

The process step shown in FIG. 2I can be followed by further process steps and patterning operations, but these need not be described in the context of the present invention.

Figure 3A:
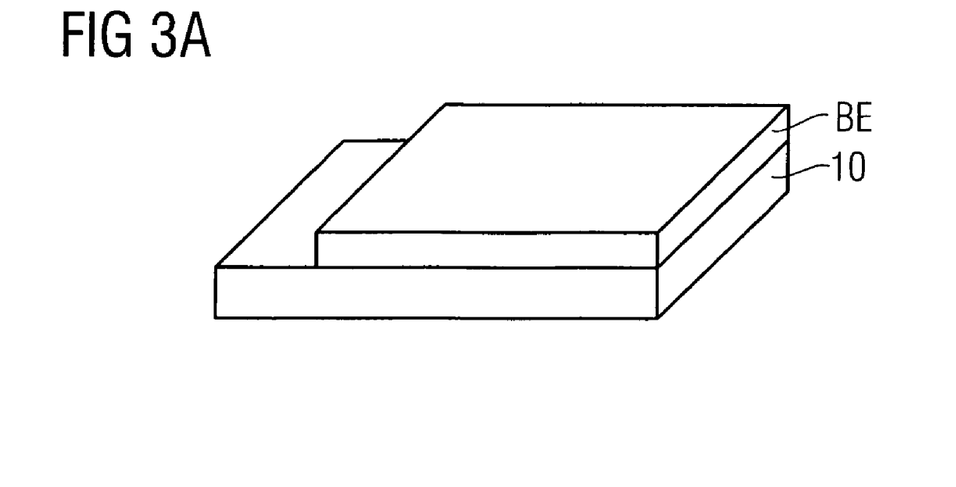
FIGS. 3A-3E are diagrammatic, perspective cross-sectional views of individual process steps of a fabrication method in accordance with a third embodiment of the invention, where the nanoporous aluminium oxide layer is used for direct masking.
Figure 3B:
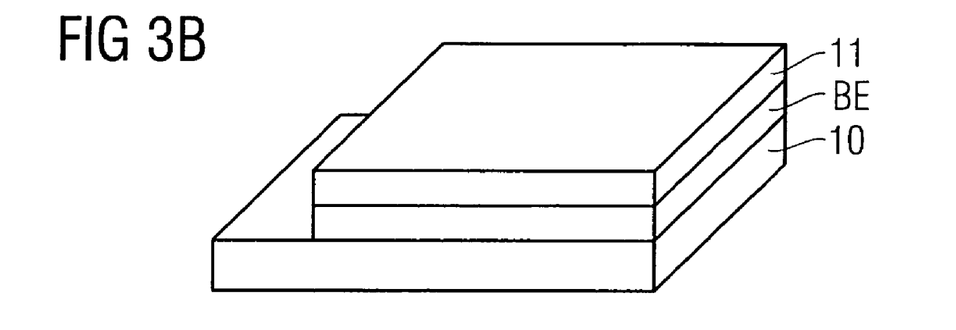
Figure 3C:
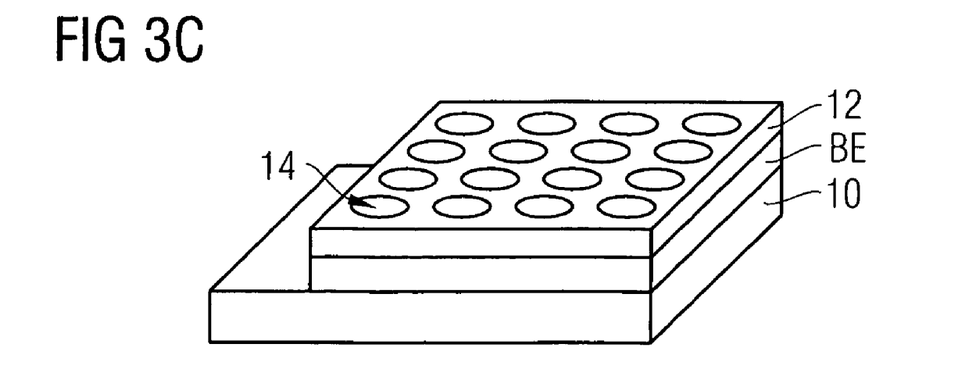
Figure 3D:
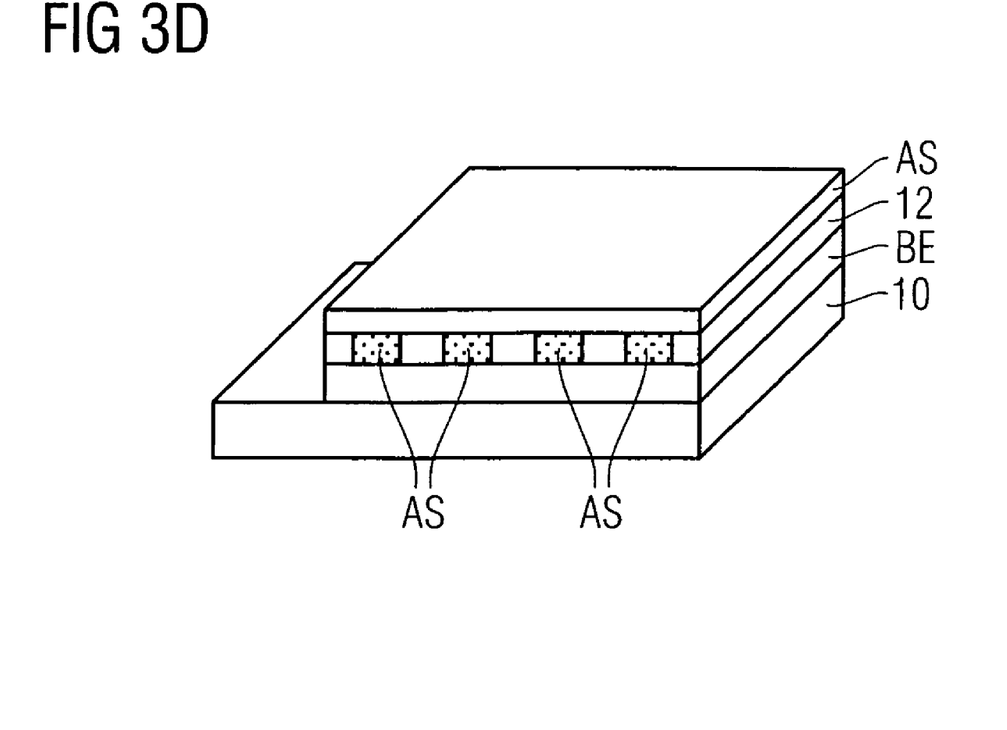
Figure 3E:
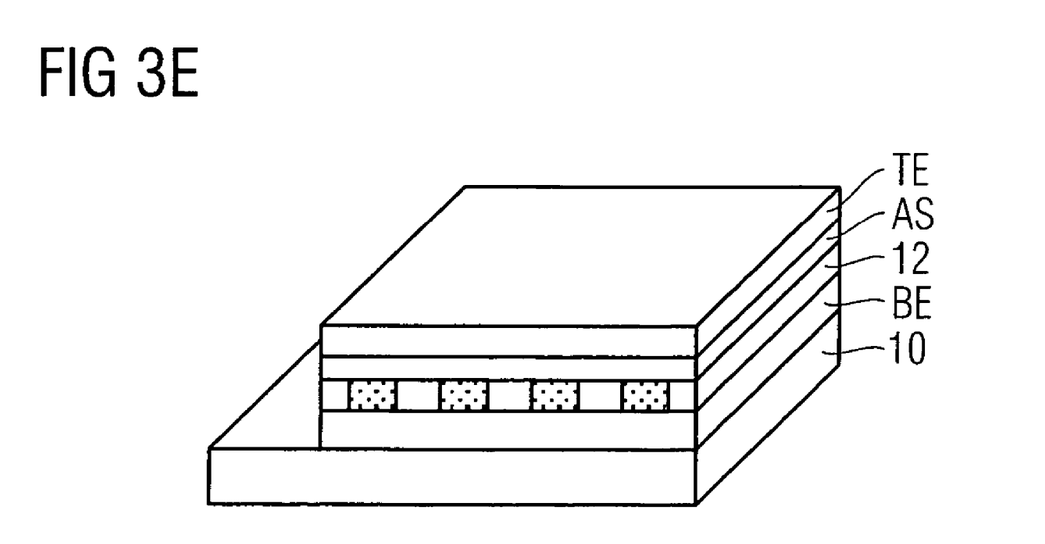

In a third embodiment in accordance with the invention, the proposed nanoporous aluminium oxide mask can also be used for direct masking, i.e. as an insulating current aperture. This process sequence is illustrated in FIGS. 3A-3E. The starting point is a substrate 10 which has been pre-processed as far as the bottom electrode BE (FIG. 3A). An aluminium layer 11 is deposited over the bottom electrode BE (FIG. 3B). The aluminium layer 11 is anodically oxidized and transformed into an aluminium oxide layer 12 including nanopores 14 (FIG. 3C). The material of the active layer AS is deposited over the aluminium oxide layer 12 and into the nanopores 14 (FIG. 3D). It will be apparent from this that the nanoporous aluminium oxide layer 12 is used directly as an insulating current aperture for the flow of current between bottom and top electrodes. Finally, as shown in FIG. 3E, the metallization of the top electrode TE is deposited over the active layer AS. Further process steps and patterning operations may follow, but these are not illustrated in the figure since they are of no importance to the implementation of the invention.

In each of the fabrication methods described and illustrated above with reference to FIGS. 1A-1G, FIGS. 2A-2I and FIGS. 3A-3E, the mean diameter of the nanopores 14 is significantly smaller than the typical cell area, so that the contact surface between electrode and active material can be set in virtually any desired form by varying the process parameters of the aluminium mask. The resulting surface areas, which are of sublithographic size, drastically reduce the current required for programming and erasing. The typical mean diameter of the nanopores is $\leq 10$ nm, down to as little as 4 nm.

Figure 4:
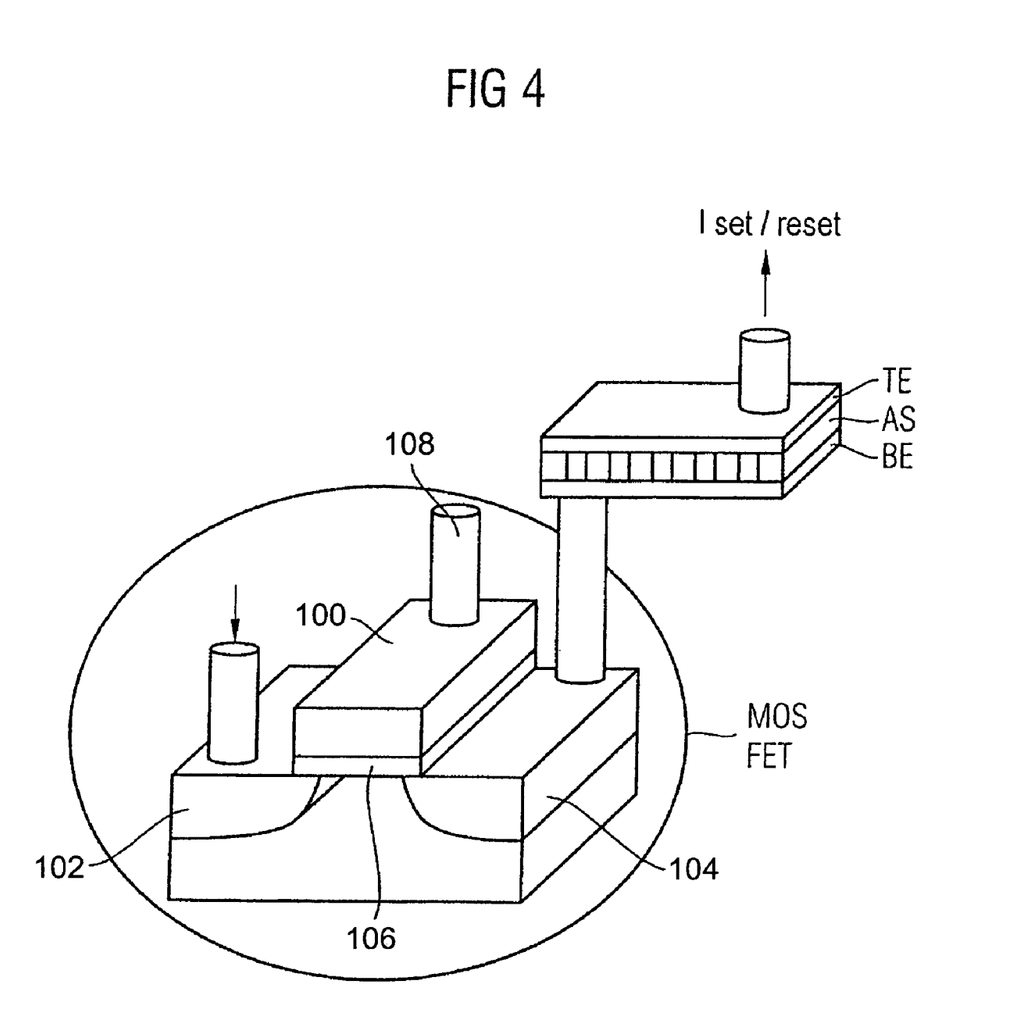
FIG. 4 is a diagrammatic, perspective cross-sectional view of a structure of a memory cell based upon phase change materials together with a select/driving transistor.

FIG. 4 shows a memory cell fabricated in this way on the basis of an active phase change material (active layer AS) with bottom electrode BE and top electrode TE in combination with a field-effect transistor that includes, for example, a gate 100, source 102 and drain 104, gate oxide 106 and control terminal 108. Of course, the driving/select element may instead also be a bipolar transistor, a bipolar diode, a Schottky diode, etc. In this context, the current intensity for the programming current $I_{set}$ and the erasing current $I_{reset}$ is greatly reduced by the fabrication methods in accordance with the invention, with the result that a compact cell array with a competitive cell area can be realized using a PCRAM. Moreover, the energy consumption of a memory component of this type is reduced and/or highly parallel programming of the cells is made possible.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF DESIGNATION

| | |
|---|---|
| 10 | Substrate |
| 11 | Aluminium layer |
| 12 | Aluminium oxide layer |
| 13 | Insulator layer |
| 14 | Nanopores |
| 131, 132 | Remaining rods or pillars of the insulator layer 13 |
| AS | Active layer |
| BE | Bottom electrode |
| ISET/IRESET | Programming/erasing current pulse |
| TE | Top electrode |
| 100 | Gate |
| 102 | Source |
| 104 | Drain |
| 106 | Gate oxide |
| 108 | Control terminal |

What is claimed:

1. A method for fabricating memory components comprising memory cells based on an active layer of an active material, wherein the phase state of the active layer is changed from an amorphous state to a crystalline state and from a crystalline state into an amorphous state by a first and second current pulse flowing between a bottom electrode and a top electrode, the active layer being enclosed between the bottom and top electrodes, wherein the method comprises:
   forming the bottom electrode on a substrate;
   forming an aluminium oxide layer that includes nanopores above the bottom electrode;
   depositing an insulator material directly on top of the aluminium oxide layer and into the nanopores;
      removing the aluminium oxide layer and some of the insulator material that projects above the aluminium oxide layer so as to expose a pattern of insulator material portions that were deposited into the nanopores;
   depositing the active layer over the pattern of exposed insulator material portions; and
   depositing the top electrode over the active layer.

2. The method of claim 1, wherein the aluminium oxide layer including the nanopores is formed by anodic oxidation of a deposited aluminium layer.

3. The method of claim 2, wherein the layer thickness of the aluminium layer and oxidation process conditions are selected such that a mean diameter of the nanopores is ≦10 nm.

4. The method of claim 2, wherein the layer thickness of the aluminium layer and oxidation process conditions are selected such that the mean diameter of the nanopores is ≦4 nm.

5. The method of claim 1, wherein the bottom electrode material comprises one of W, TiN, TiW, and TiAlN.

6. The method of claim 1, wherein the insulator material comprises one of $SiO_2$ and $Si_3N_4$.

7. The method of claim 1, wherein the active layer comprises $Ge_2Sb_2Te_5$.

8. The method of claim 1, wherein the active layer comprises Ag—In—Sb—Te.

9. A method for fabricating memory components comprising memory cells based on an active layer of an active material, wherein the phase state of the active layer is changed from an amorphous state to a crystalline state and from a crystalline state into an amorphous state by a first and second current pulse flowing between a bottom electrode and a top electrode, the active layer being enclosed between the bottom and top electrodes, wherein the method comprises:
   forming an aluminium oxide layer that includes nanopores on top of a substrate;
   depositing a bottom electrode material directly over the aluminium oxide layer and into the nanopores;
   removing some of the bottom electrode material that projects above the aluminium oxide layer;
   removing the aluminium oxide layer so as to expose a pattern of bottom electrode material portions that were deposited into the nanopores;
   depositing an insulator material directly over the pattern of exposed bottom electrode material portions;
   planarizing the insulator material to expose a top portion of the pattern of bottom electrode material portions;
   depositing the active layer over the planarized insulator material and exposed top portions of the pattern of bottom electrode material portions; and
   depositing the top electrode over the active layer.

10. The method of claim 9, wherein the aluminium oxide layer including the nanopores is formed by anodic oxidation of a deposited aluminium layer.

11. The method of claim 10, wherein the layer thickness of the aluminium layer and oxidation process conditions are selected such that a mean diameter of the nanopores is ≦10 nm.

12. The method of claim 10, wherein the layer thickness of the aluminium layer and oxidation process conditions are selected such that the mean diameter of the nanopores is ≦4 nm.

13. The method of claim 9, wherein the bottom electrode material comprises one of W, TiN, TiW, and TiAlN.

14. The method of claim 9, wherein the insulator material comprises one of $SiO_2$ and $Si_3N_4$.

15. The method of claim 9, wherein the active layer comprises $Ge_2Sb_2Te_5$.

16. The method of claim 9, wherein the active layer comprises Ag—In—Sb—Te.

17. A method for fabricating memory components comprising memory cells based on an active layer of an active material, wherein the phase state of the active layer is changed from an amorphous state to a crystalline state and from a crystalline state into an amorphous state by a first and second current pulse flowing between a bottom electrode and a top electrode, the active layer being enclosed between the bottom and top electrodes, wherein the method comprises:
   depositing a bottom electrode material areally on top of a substrate;
   forming an aluminum oxide layer that includes nanopores above the bottom electrode material, wherein the nanopores of the aluminium oxide layer extend to the bottom electrode material;
   etching exposed sections of the bottom electrode material that correspond with the nanopores of the aluminium oxide material to form a pattern of bottom electrode material portions that are covered by the aluminium oxide layer;
   removing the aluminium oxide layer;
   depositing an insulator material over the pattern of bottom electrode material portions;
      planarizing the insulator material to expose top portions of the pattern of bottom electrode portions;
      depositing the active layer over the insulator material and exposed top portions of the pattern of bottom electrode portions; and
   depositing the top electrode over the active layer.

18. The method of claim 17, wherein the aluminium oxide layer including the nanopores is formed by anodic oxidation of a deposited aluminium layer.

19. The method of claim 18, wherein the layer thickness of the aluminium layer and oxidation process conditions are selected such that a mean diameter of the nanopores is $\leq 10$ nm.

20. The method of claim 18, wherein the layer thickness of the aluminium layer and oxidation process conditions are selected such that the mean diameter of the nanopores is $\leq 4$ nm.

21. The method of claim 17, wherein the bottom electrode material comprises one of W, TiN, TiW, and TiAlN.

22. The method of claim 17, wherein the insulator material comprises one of $SiO_2$ and $Si_3N_4$.

23. The method of claim 17, wherein the active layer comprises $Ge_2Sb_2Te_5$.

24. The method of claim 17, wherein the active layer comprises Ag—In—Sb—Te.

25. A method for fabricating memory components comprising memory cells based on an active layer of an active material, wherein the phase state of the active layer is changed from an amorphous state to a crystalline state and from a crystalline state to an amorphous state by a first and second current pulse flowing between a top electrode and a bottom electrode, the active layer being enclosed between the bottom and top electrodes, wherein the method comprises:

depositing a bottom electrode material directly on top of a substrate;

forming an aluminum oxide layer that includes nanopores over the bottom electrode material; and forming the material of the active layer directly on top of the aluminum oxide layer and into the nanopores of the aluminum oxide layer;

wherein the aluminum oxide layer directly serves as an insulating current aperture.

26. The method of claim 25, wherein the aluminum oxide layer including the nanopores is formed by anodic oxidation of a deposited aluminum layer.

27. The method of claim 26, wherein the layer thickness of the aluminum layer and oxidation process conditions are selected such that a mean diameter of the nanopores is $\leq 10$ nm.

28. The method of claim 26, wherein the layer thickness of the aluminum layer and oxidation process conditions are selected such that the mean diameter of the nanopores is $\leq 4$ m.

29. The method of claim 25, wherein the bottom electrode material comprises one of W, TiN, TiW, and TiAlN.

30. The method of claim 25, wherein the active layer comprises $Ge_2Sb_2Te_5$.

31. The method of claim 25, wherein the active layer comprises Ag—In—Sb—Te.

* * * * *